US 11,731,568 B2

(12) United States Patent
Omura (10) Patent No.: US 11,731,568 B2
(45) Date of Patent: Aug. 22, 2023

(54) COMMUNICATION UNIT AND VEHICLE (71) Applicant: YAMAHA MOTOR POWER PRODUCTS KABUSHIKI KAISHA, Kakegawa (JP)

(72) Inventor: Yuichi Omura, Shizuoka (JP)

(73) Assignee: YAMAHA MOTOR POWER PRODUCTS KABUSHIKI KAISHA, Shizuoka (JP)

(*) Notice: Subject to any disclaimer, the term of this patent is extended or adjusted under 35 U.S.C. 154(b) by 654 days.

(21) Appl. No.: 16/966,030

(22) PCT Filed: Oct. 23, 2018

(86) PCT No.: PCT/JP2018/039390
§ 371 (c)(1),
(2) Date: Jul. 30, 2020

(87) PCT Pub. No.: WO2019/159437
PCT Pub. Date: Aug. 22, 2019

(65) Prior Publication Data
US 2020/0353875 A1 Nov. 12, 2020

(30) Foreign Application Priority Data
Feb. 15, 2018 (JP) ................. 2018-025346

(51) Int. Cl.
H04B 1/3822 (2015.01)
B60R 11/02 (2006.01)
B60R 16/023 (2006.01)
H01Q 1/20 (2006.01)
H05K 5/03 (2006.01)

(52) U.S. Cl.
CPC ............ B60R 11/02 (2013.01); B60R 16/023 (2013.01); H01Q 1/20 (2013.01); H04B 1/3822 (2013.01); H05K 5/03 (2013.01)

(58) Field of Classification Search
CPC ................ B60R 11/02; B60R 2011/0094
(Continued)

(56) References Cited

U.S. PATENT DOCUMENTS

2005/0227542 A1* 10/2005 Fukushima ............ H05K 7/026
439/620.27
2012/0062428 A1 3/2012 Imano et al.
(Continued)

FOREIGN PATENT DOCUMENTS

CN 1684329 A 10/2005
CN 102428605 A 4/2012
(Continued)

OTHER PUBLICATIONS

Official Communication issued in corresponding Chinese Patent Application No. 201880089420.8, dated Dec. 17, 2021.
(Continued)

Primary Examiner — Qutbuddin Ghulamali
(74) Attorney, Agent, or Firm — Keating and Bennett, LLP (57) ABSTRACT A communication unit includes a circuit board on which a communication circuit is provided, an antenna connected to the circuit board, and a housing storing the circuit board and the antenna. The housing includes an upper plate, a lower plate, and an outer wall. The upper plate is located above the lower plate. An inner space is defined by the upper plate, the lower plate, and the outer wall. In the inner space, an inner wall surrounds the entire periphery of the circuit board in a plan view and projects from a lower surface of the upper plate to a position farther downward than the circuit board in a side view.

13 Claims, 11 Drawing Sheets (58) Field of Classification Search
USPC .................................................... 340/425.5
See application file for complete search history.

(56) References Cited

U.S. PATENT DOCUMENTS

| | | | | |
|---|---|---|---|---|
| 2012/0127043 A1* | 5/2012 | Imano | ................ | H01Q 9/0421 343/702 |
| 2013/0070433 A1 | 3/2013 | Onishi | | |
| 2018/0013230 A1 | 1/2018 | Oda et al. | | |

FOREIGN PATENT DOCUMENTS

| | | | |
|---|---|---|---|
| CN | 103000984 | A | 3/2013 |
| CN | 107591755 | A | 1/2018 |
| JP | 11-312998 | A | 11/1999 |
| JP | 2002-225640 | A | 8/2002 |
| JP | 2005-217075 | A | 8/2005 |
| JP | 2007-300198 | A | 11/2007 |
| JP | 3161101 | U | 7/2010 |
| JP | 2011-35822 | A | 2/2011 |
| JP | 2012-74524 | A | 4/2012 |

OTHER PUBLICATIONS

Official Communication issued in corresponding Chinese Patent Application No. 201880089420.8, dated Jun. 1, 2021.
Official Communication issued in International Patent Application No. PCT/JP2018/039390, dated Dec. 25, 2018.
First Office Action in KR10-2020-7021633, dated Jan. 19, 2023, 5 pages.

* cited by examiner

COMMUNICATION UNIT AND VEHICLE

BACKGROUND OF THE INVENTION

1. Field of the Invention

The present invention relates to a communication unit and a vehicle including the communication unit.

2. Description of the Related Art

For example, a communication unit that communicates with a predetermined fixed point on a traveling path is provided in a vehicle such as a golf cart that moves along an electromagnetic induction line buried in the ground. Since the communication unit is provided in a lower part of the vehicle, so that it is necessary to reduce the influence of water, mud or the like to be received from the ground.

In JP 2007-300198 A, a sealing structure of an electric appliance is described. In the sealing structure of JP 2007-300198 A, the inside of a casing is partitioned into a first storage space and a second storage space by a partition plate. A circuit block is stored in the first storage space, and an antenna block is stored in the second storage space. The circuit block is sealed with a sealing resin.

With the sealing structure described in JP 2007-300198 A, a process of sealing the circuit block in the casing with the resin at the time of manufacture is required. Further, an adjustment work of the circuit block cannot be performed after sealing. Further, it is difficult and costly to manufacture a communication unit having a completely sealed structure.

SUMMARY OF THE INVENTION

Preferred embodiments of the present invention provide communication units, each of which is less influenced by water without requiring a completely sealed structure even in a case where the communication unit is located at a position close to the ground, and is manufactured easily and at low cost, and also provide vehicles each including a communication unit.

A communication unit according to a preferred embodiment of the present invention includes a circuit board on which a communication circuit is provided, an antenna connected to the communication circuit, and a housing that stores the circuit board and the antenna, wherein the housing includes an upper plate, a lower plate, and an outer wall, the upper plate is located above the lower plate, an inner space is defined by the upper plate, the lower plate, and the outer wall, and an inner wall is provided in the inner space and surrounds an entire periphery of the circuit board in a plan view and projects from a lower surface of the upper plate to a position farther downward than the circuit board in a side view.

In the communication unit, even in a case where water has intruded into the inner space of the housing, because the circuit board is surrounded by the upper plate and the inner wall, the intruding water is unlikely to reach the circuit board. Further, because the housing does not require a completely sealed structure, the manufacturing cost is reduced, and the manufacturing process is not complicated. Therefore, even in a case where the communication unit is located at a position close to the ground, the communication unit is less influenced by water without requiring a completely sealed structure. Further, the communication unit is easily manufactured at low cost.

The housing may further include a supporter that supports the antenna in the inner space such that a first space is provided between the antenna and the lower surface of the upper plate and a second space is provided between the antenna and an upper surface of the lower plate, the supporter may include a plurality of projections that project downwardly from the lower surface of the upper plate, and the antenna may be supported by the plurality of projections in the inner space.

In this case, because the antenna is suspended from the upper plate of the housing in the inner space, any water adhering to the antenna is likely to drop, and water staying on the surface of the antenna is significantly reduced or prevented. As a result, significant degradation of performance of the antenna is significantly reduced or prevented.

The antenna may include adjacent first and second antenna portions that are spaced apart from each other, the plurality of projections include a first projection that supports the first antenna portion and a second projection that supports the second antenna portion, and the plurality of projections may be located such that a supporting portion of the first projection with respect to the first antenna portion and a supporting portion of the second projection with respect to the second antenna portion are discontinuous.

In this case, bridging between the first and second projections by water is significantly reduced or prevented. Thus, water staying on the surfaces of the first and second antenna portions and between the first and second antenna portions is significantly reduced or prevented.

The housing may include a casing including the upper plate and the outer wall and that includes a lower opening, and a lid including the lower plate and that closes the lower opening of the casing, an outer edge of the lower opening may be located outside of a region surrounded by a lower end of the inner wall in a plan view, and the inner space may be defined by connecting the outer wall of the casing and the lid to each other.

In this case, the outer edge of the lower opening of the housing is located outside of the lower end of the inner wall, and the lid closes the lower opening. Thus, water is even less likely to reach the circuit board. Further, even in a case where water intrudes into the inner space of the housing, the intruding water is drained to the outside from the connection between the casing and the lid.

The outer edge of the lower opening may be provided at a lower end of the outer wall. In this case, the likelihood of water reaching the circuit board is reduced with a simple structure.

A lower edge of the outer wall of the casing may include a first bending structure, an outer edge of the lid may include a second bending structure, the lower edge of the outer wall and the outer edge of the lid may be connected to each other, and a labyrinth structure may be defined by the first bending structure and the second bending structure.

In this case, because the labyrinth structure is defined by the first bending structure of the casing and the second bending structure of the lid, water intrusion into the inner space of the housing is reduced even with the casing and the lid not having a completely sealed structure.

A drainage path may be provided in an edge at a lower end of the housing. In this case, even in a case where water has intruded into the inner space of the housing, the water is moved to the lower portion of the inner space by gravity and drained through the drainage path of the housing. Thus, water staying in the inner space of the housing is significantly reduced or prevented.

A first hole that causes the drainage path to communicate with a space below the housing may be provided in the housing, and a second hole that causes the drainage path to communicate with a space outside of the housing above the first hole may be provided in the housing.

In this case, the water that has been guided from the inner space of the housing to the drainage path is drained downwardly of the housing through the first hole. Meanwhile, the water that has splashed and entered into the drainage path from below the housing through the first hole is directly drained through the second hole above. Thus, water is unlikely to intrude into the inner space of the housing through the drainage path.

An upper surface of the lower plate of the housing may be inclined outwardly and downwardly. In this case, the water adhering to the upper surface of the lower plate of the housing is likely to flow downwardly. Thus, water staying in the inner space of the housing is significantly reduced or prevented.

The antenna may be located between the outer wall and the inner wall. In this case, the circuit board is located in the space inside of the inner wall, and the antenna is located in the space between the inner and outer walls. In this case, degradation of performance due to temporary adhesion of water to the antenna is less than degradation of performance due to adhesion of water to the circuit board. With such a configuration, the space inside of the inner wall surrounding the circuit board is reduced. Thus, the distance between the inner and outer walls is increased. As a result, the circuit board is protected from the water that has intruded into the inner space of the housing.

The circuit board may be located at a position higher than the antenna. In this case, likelihood of the circuit board coming into contact with water is reduced while the distance between the antenna and the ground is reduced.

A vehicle according to another preferred embodiment of the present invention includes a main frame including a pair of left and right frame members, a floor member provided at a position farther upward than the main frame, a steering wheel to support the main frame on the ground in a vehicle front-and-rear direction, and the above-described communication unit, wherein the communication unit is located between the pair of left and right frame members in a plan view of the vehicle, and an uppermost portion of the communication unit is located at a position farther downward than a lower surface of the floor member, and a lowermost portion of the communication unit is located at a position farther upward than a lower end of the main frame.

In this case, because the communication unit is located at a position farther downward than the lower surface of the floor member, the distance between the antenna and the ground is reduced. Thus, a good communication state between the communication unit and a communication subject in the ground is maintained. Further, because the communication unit is located at a position farther upward than the lower end of the main frame, contact between the communication unit and the ground during traveling of the vehicle is avoided. Further, when the vehicle is transported by a forklift, forks do not come into contact with the communication unit. Thus, damage to the communication unit is significantly reduced or prevented.

The vehicle may further include a wheel provided at a position farther forward or rearward than the steering wheel in a side view of the vehicle, wherein the antenna of the communication unit may be located at a position closer to the steering wheel than to the wheel in the side view of the vehicle.

In this case, a change in distance between the antenna and the communication subject in the ground depending on a steering angle of the steering wheel is significantly reduced or prevented.

The present invention reduces the influence of water without requiring a completely sealed structure even in a case where the communication unit is located at a position close to the ground, and enables the communication unit to be manufactured easily at low cost.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Communication units and vehicles including the communication units according to preferred embodiments of the present invention will be described below.

(1) Configuration of Communication Unit

Figure 1:
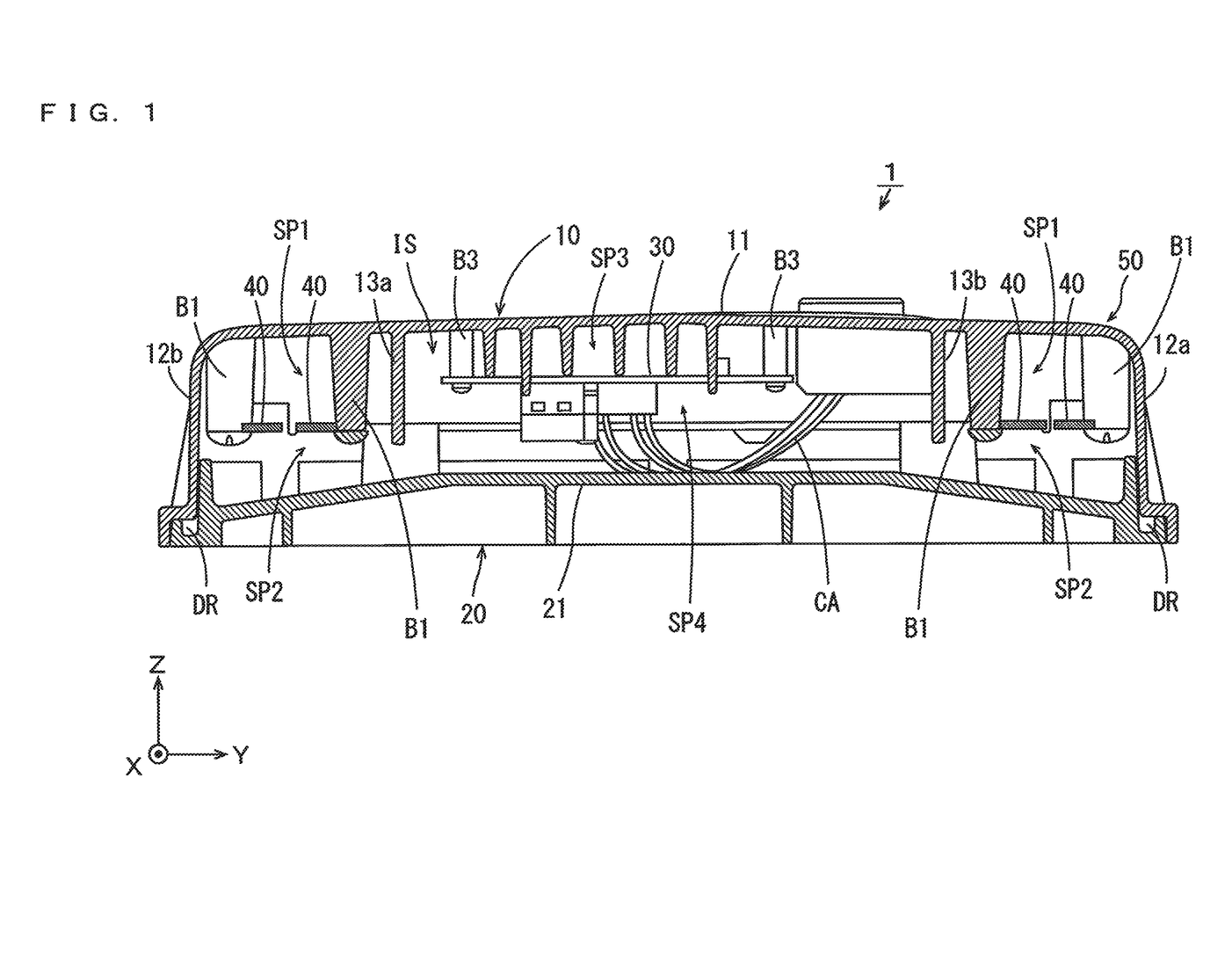
FIG. 1 is a cross-sectional view of a communication unit according to a preferred embodiment of the present invention.
Figure 2:
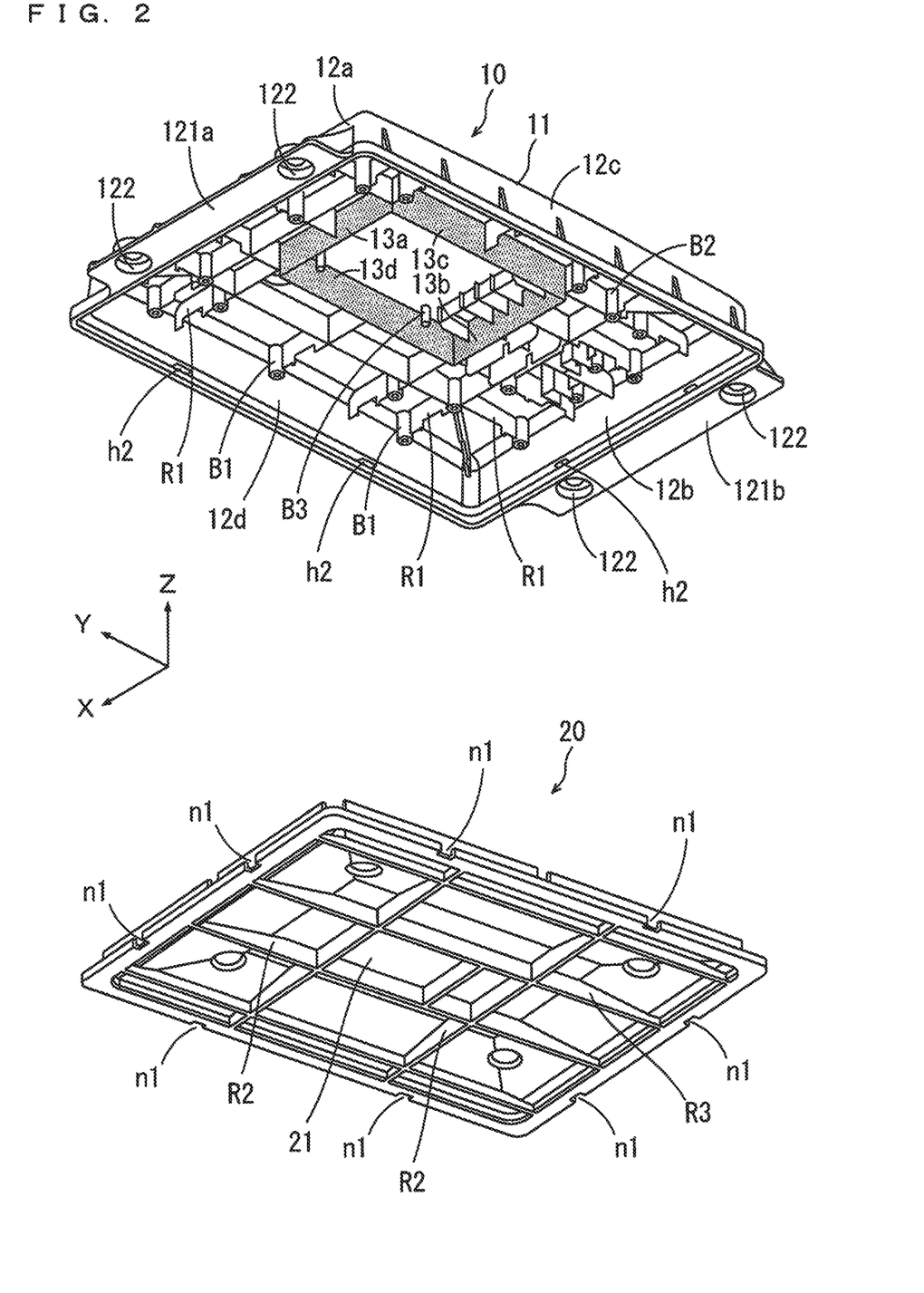
FIG. 2 is an exploded perspective view in a case where a housing of the communication unit of FIG. 1 is viewed from obliquely below.
Figure 3:
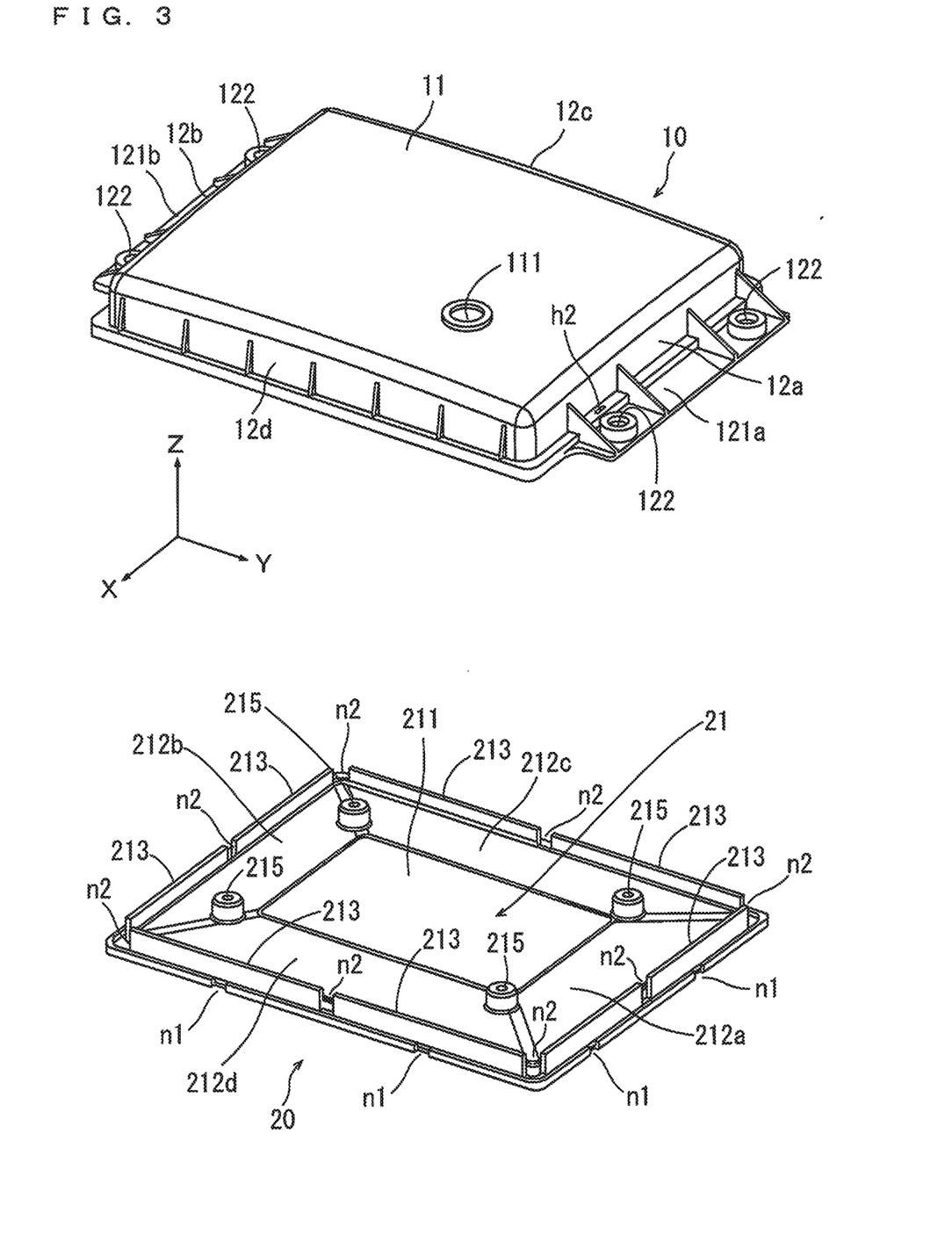
FIG. 3 is an exploded perspective view in a case where the housing of the communication unit of FIG. 1 is viewed from obliquely above.

FIG. 1 is a cross-sectional view of the communication unit according to a preferred embodiment of the present invention. FIG. 2 is an exploded perspective view of the communication unit in a case where a housing of the communication unit of FIG. 1 is viewed from obliquely below. FIG. 3 is an exploded perspective view of the communication unit in a case where the casing of the communication unit of FIG. 1 is viewed from obliquely above. FIGS. 1 to 3 and the subsequent figures are accompanied by arrows that indicate X, Y, and Z directions orthogonal to one another for the clarity of a positional relationship. The X and Y directions are orthogonal to each other in a horizontal plane, and the Z direction corresponds to a vertical direction.

As shown in FIG. 1, the communication unit 1 includes a casing 10, a lid 20, a circuit board 30, and an antenna 40. The casing 10 and the lid 20 define the housing 50. The circuit board 30 and the antenna 40 are stored in the housing 50. The casing 10 includes a lower opening. The lower opening of the casing 10 is closed by the lid 20. An inner space IS is defined by the casing 10 and the lid 20. A wiring cable CA is connected to the circuit board 30.

As shown in FIGS. 2 and 3, the casing 10 includes a rectangular upper plate 11 (see FIG. 3) and four outer walls 12a to 12d. In the present example, the upper plate 11 includes a pair of short sides extending in the X direction and a pair of long sides extending in the Y direction. A pair of outer walls 12a, 12b project downwardly from the two short sides of the upper plate 11. The other pair of outer walls 12c, 12d project downwardly from the two long sides of the upper plate 11.

As shown in FIG. 2, in the region surrounded by the outer walls 12a to 12d, four inner walls 13a to 13d project downwardly from the lower surface of the upper plate 11. A pair of inner walls 13a, 13b extend in the X direction, and the other pair of inner walls 13c, 13d extend in the Y direction. The positions of the lower ends of the inner walls 13a to 13d are higher than the positions of the lower ends of the outer walls 12a to 12d. In FIG. 2, a dotted pattern is applied to the inner walls 13a to 13d.

A plurality of ribs R1 and a plurality of bosses B1, B2, B3 are provided to project downwardly from the lower surface of the upper plate 11. The detailed arrangement of the plurality of ribs R1 and the plurality of bosses B1, B2, B3 will be described below. Attachment portions 121a, 121b project, respectively, outwardly and horizontally from the lower ends of the pair of outer walls 12a, 12b. A plurality of attachment holes 122 are provided in each of the attachment portions 121a, 121b. The casing 10 is integrally made of a plastic material.

The lid 20 includes a lower plate 21. A plurality of ribs R2 for reinforcement are provided in a grid pattern at the lower surface of the lower plate 21. A plurality of cutouts n1 are provided in an outer peripheral edge of the lower plate 21. The lid 20 is integrally made of a plastic material similarly to the casing 10.

As shown in FIG. 3, a take-out hole 111 for the wiring cable CA is provided in the portion between the outer wall 12d and the inner wall 13d in the upper plate 11 of the casing 10. The upper surface of the lower plate 21 of the lid 20 is inclined outwardly and downwardly. More specifically, the lower plate 21 includes a rectangular horizontal portion 211 and four trapezoidal inclined portions 212a to 212d. The inclined portions 212a to 212d extend, respectively, obliquely and downwardly from the four sides of the horizontal portion 211. Thus, in a case where water intrudes into the inner space IS of the housing 50, the water adhering to the upper surface of the lower plate 21 of the housing 50 is likely to flow downwardly.

A plurality of projection walls 213 project upwardly and extending along the edge of the upper surface of the lid 20. A cutout n2 for drainage is provided between adjacent projection walls 213. Further, a plurality (four in the present example) of bases 215 are provided on the upper surface of the lid 20. A though hole is provided in each base 215. The plurality of bases 215 are attached to bosses B2, described below, for attaching the lid of the casing 10 with screws.

Figure 4:
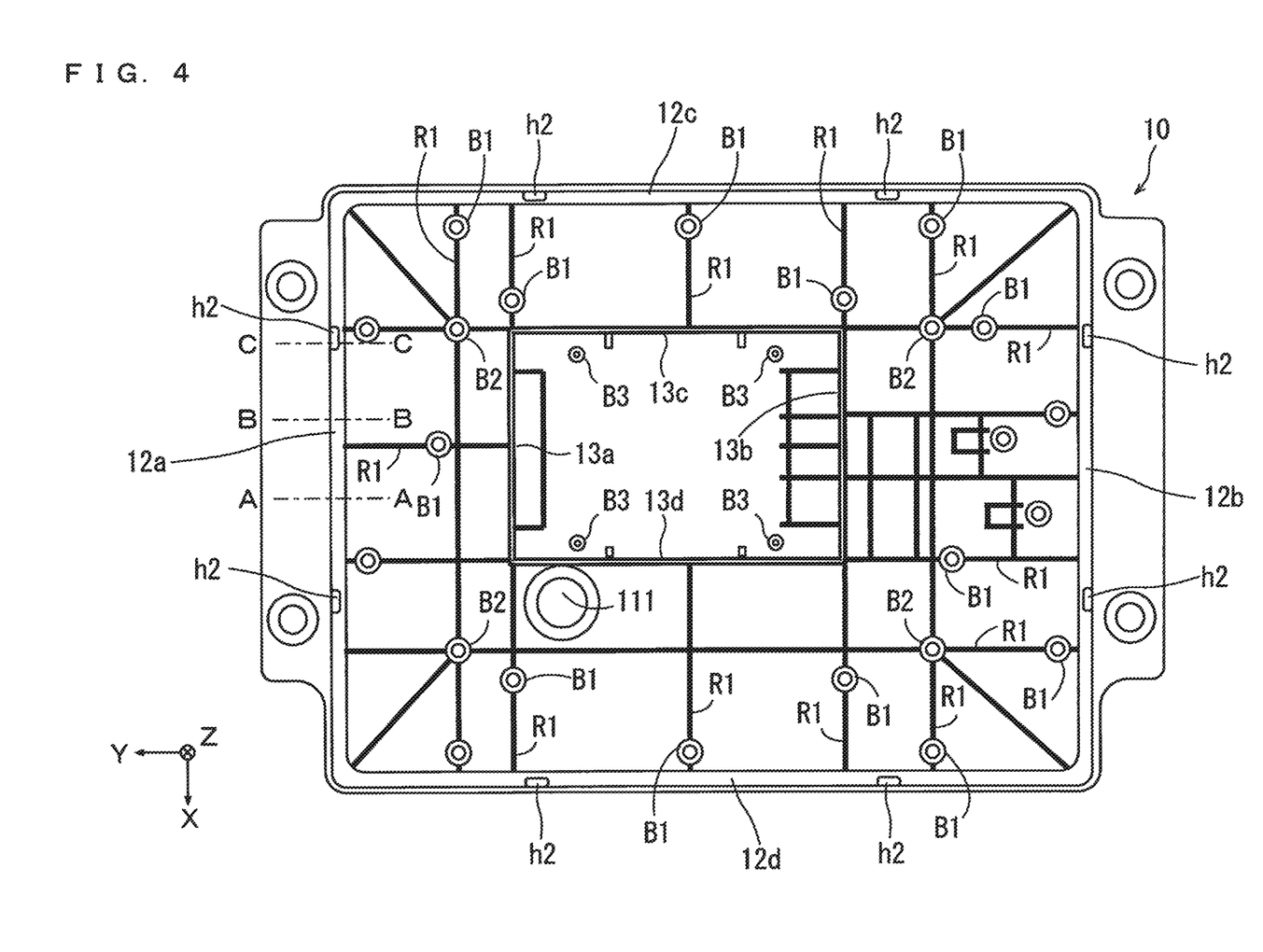
FIG. 4 is a bottom view of a casing to which a circuit board or an antenna is not attached.

FIG. 4 is a bottom view of the casing 10 to which the circuit board 30 or the antenna 40 is not attached. As shown in detail in FIG. 4, in the region between the outer walls 12a to 12d and the inner walls 13a to 13d, the plurality of ribs R1 for supporting the antenna and for reinforcement extend in the X and Y directions. The plurality of ribs R1 are an example of a supporter or a plurality of projections. The detailed shape of the ribs R1 will be described below.

Further, in the region between the outer walls 12a to 12d and the inner walls 13a to 13d, a plurality of bosses B1 for holding the antenna and a plurality (four in the present example) of bosses B2 for attaching the lid are provided. Further, in the region surrounded by the inner walls 13a to 13d, a plurality of bosses B3 for holding the circuit board are provided. A screw hole is provided in each of the bosses B1, B2, B3. Each boss B1 is integral with the rib R1. Out of two bosses B1 located at two adjacent ribs R1, one boss B1 is provided at an inner position (a position closer to the inner walls 13a to 13d), and the other boss B1 is provided at an outer position (a position closer to the outer walls 12a to 12d).

Figure 5:
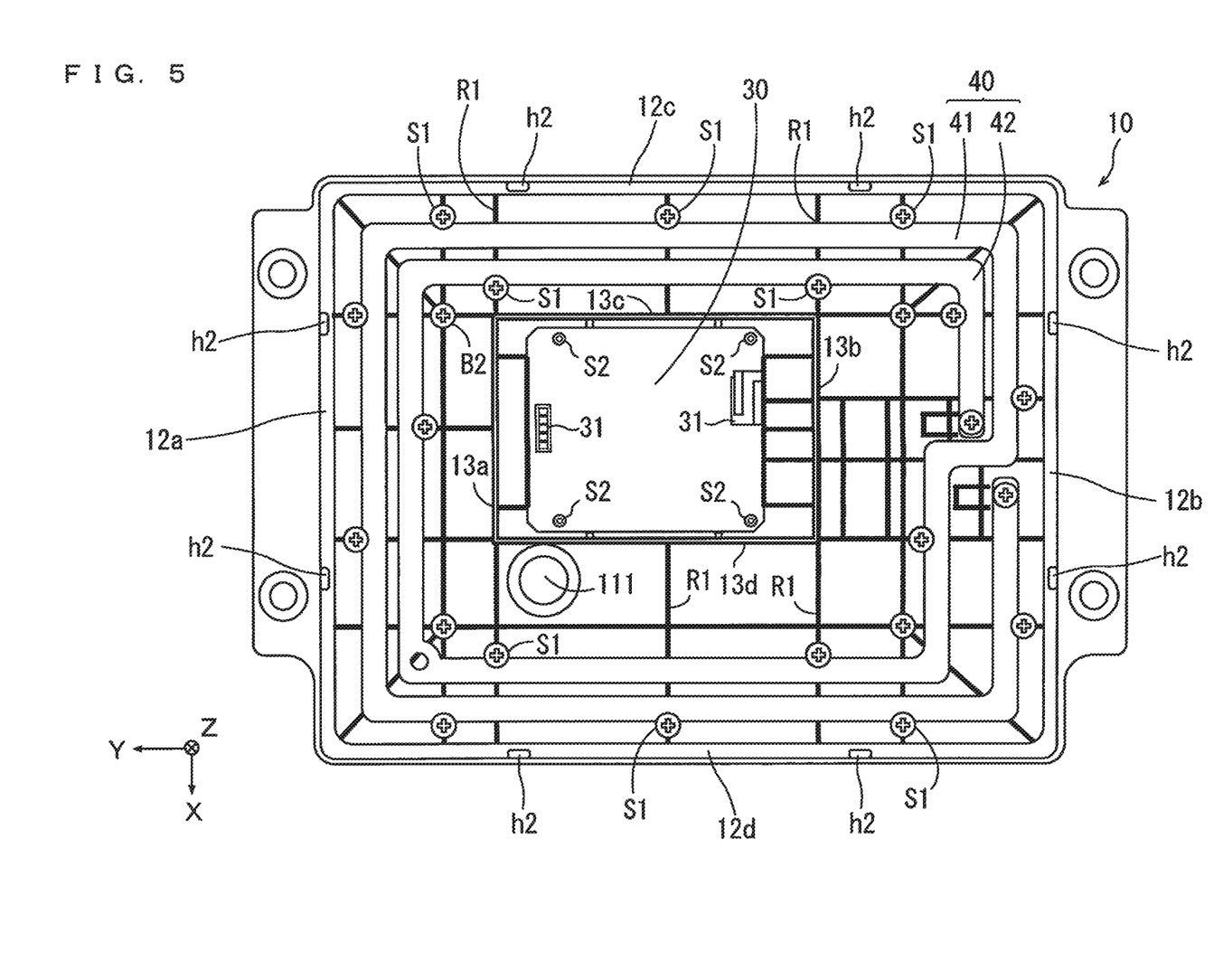
FIG. 5 is a bottom view of the casing to which the circuit board and the antenna are attached.

FIG. 5 is a bottom view of the casing 10 to which the circuit board 30 and the antenna 40 are attached. In the region between the outer walls 12a to 12d and the inner walls 13a to 13d, the antenna 40 is provided on the plurality of ribs R1 and extends in a substantially rectangular shape. In the present example, one antenna 40 has the shape of a continuous double rectangle. The antenna 40 is fixed to the plurality of bosses B1 of FIG. 4 by screws S1. Both ends of the antenna 40 are electrically connected to the circuit board 30.

In the region surrounded by the inner walls 13a to 13d, the circuit board 30 is fixed to the plurality of bosses B3 of FIG. 4 by screws S2. The circuit board 30 includes a plurality of wiring traces. A plurality of electronic components 31 are mounted on the upper and lower surfaces of the circuit board 30. Thus, a communication circuit that communicates with a RFID (Radio Frequency Identification) tag 200 (FIG. 11), described below, is provided.

The inner walls 13a to 13d surround the entire periphery of the circuit board 30 in a plan view. As shown in FIGS. 1 and 2, the inner walls 13a to 13d project to positions farther downward than the circuit board 30 in a side view.

As shown in FIG. 1, a first space SP1 is provided between the antenna 40 and the upper plate 11 of the casing 10, and a second space SP2 is provided between the antenna 40 and the lower plate 21 of the lid 20. In this case, the antenna 40 is suspended from the upper plate 11 of the housing 50 in the inner space IS.

In the present preferred embodiment, a third space SP3 is provided between the circuit board 30 and the upper plate 11, and a fourth space SP4 is provided between the circuit board 30 and the lower plate 21. The circuit board 30 is located at a position higher than the antenna 40.

Figure 6:
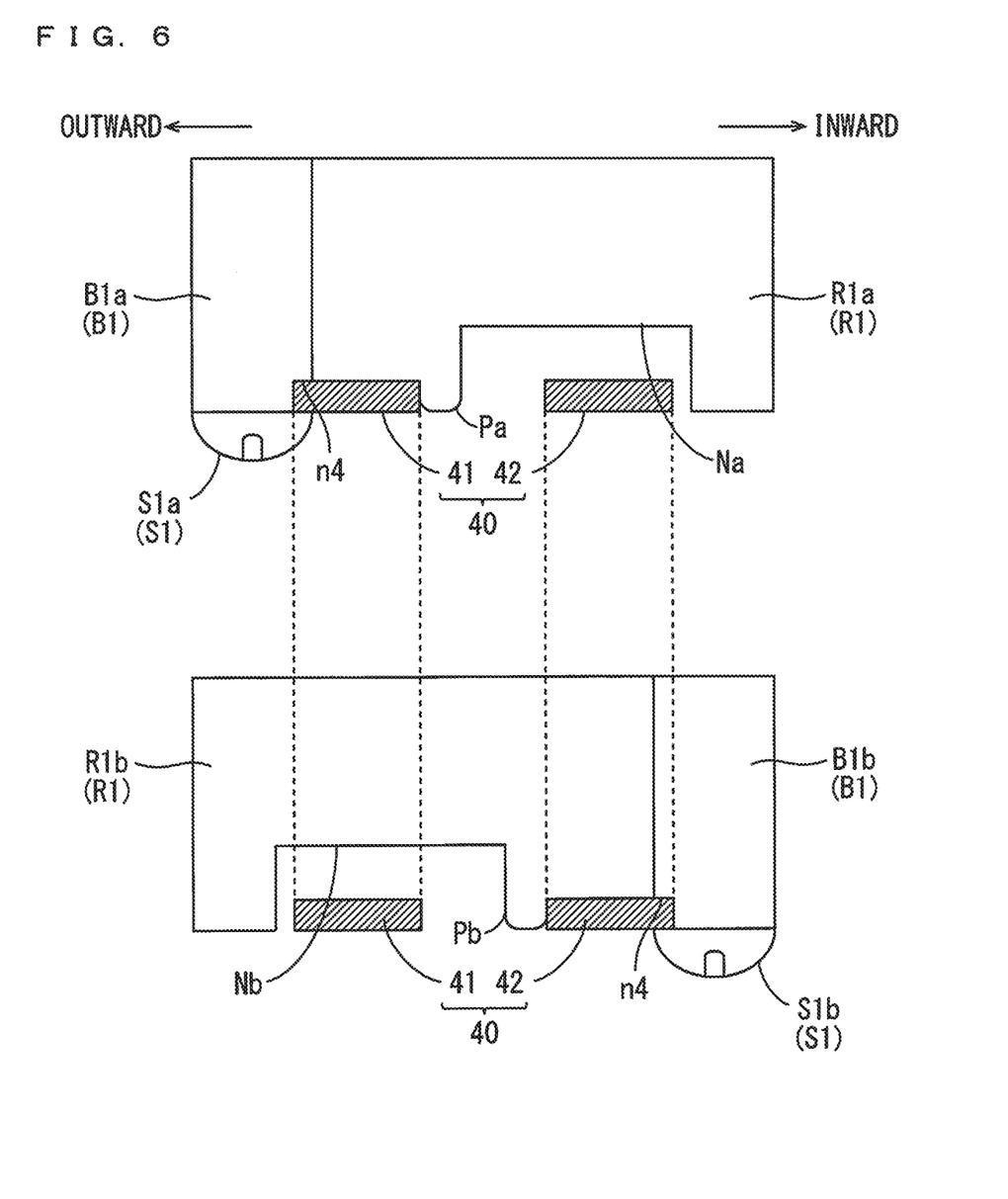
FIG. 6 is a schematic diagram showing the configuration of a rib to support the antenna.

FIG. 6 is a schematic diagram showing the configuration of ribs for supporting the antenna. In FIG. 6, a front view of two ribs R1 that are adjacent to each other in the X or Y direction are vertically oriented and shown. One of the two adjacent ribs R1 is referred to as a rib R1a, and the other rib is referred to as a rib R1b. Further, the boss B1 integral with the rib R1a is referred to as a boss B1a, and the boss B1 integral with the rib R1b is referred to as a boss B1b. Further, the screw S1 attached to the boss B1a is referred to as a screw S1a, and the screw S1 attached to the boss B1b is referred to as a screw S1b. The ribs R1a, R1b are an example of the first and second projections.

In FIG. 6, the position closer to the inner walls 13a to 13d is referred to as inward, and the position closer to the outer walls 12a to 12d is referred to as outward. A protrusion Pa that protrudes downwardly is provided at the center of the lower end of the one rib R1a. A concave portion Na is provided in an inner portion at the lower end of the rib R1a. The boss B1a is located at the outer end of the rib R1a. A protrusion Pb protruding downwardly is provided at the center of the lower end of the other rib R1b. A concave portion Nb is provided in an outer portion at the lower end of the rib R1b. The boss B1b is located at the inner end of the rib R1b.

The antenna 40 includes a first antenna portion 41 and a second antenna portion 42 which are adjacent to each other in the X or Y direction. The first antenna portion 41 is located outwardly of the second antenna portion 42.

The first antenna portion 41 is supported at the outer portion of the lower end of the one rib R1a between the protrusion Pa of the rib R1a and the boss B1a, and is connected to the boss B1a by the screw S1a. Further, the first antenna portion 41 is spaced apart from the other rib R1b in the concave portion Nb of the rib R1b.

The second antenna portion 42 is supported at the inner portion of the lower end of the other rib R1b between the protrusion Pb of the rib R1b and the boss B1b, and is connected to the boss B1b by the screw S1b. Further, the second antenna portion 42 is spaced apart from the one rib R1a in the concave portion Na of the rib R1a.

In the present example, cutouts n4 are provided at the lower ends of the bosses B1a, B1b to extend along the side surfaces of the first and second antenna portions 41, 42. The first and second antenna portions 41, 42 are fixed between the cutouts n4 of the bosses B1a, B1b and the screws S1a, S1b.

With such a configuration of the ribs R1a, R1b, the supporting portion of the rib R1a with respect to the first antenna portion 41 and the supporting portion of the rib R1b with respect to the second antenna portion 42 are discontinuous. In this case, bridging between the ribs R1a, R1b by water is significantly reduced or prevented. Thus, water staying on the surfaces of the first and second antenna portions 41, 42 and between the first and second antenna portions 41, 42 is significantly reduced or prevented.

Figure 7:
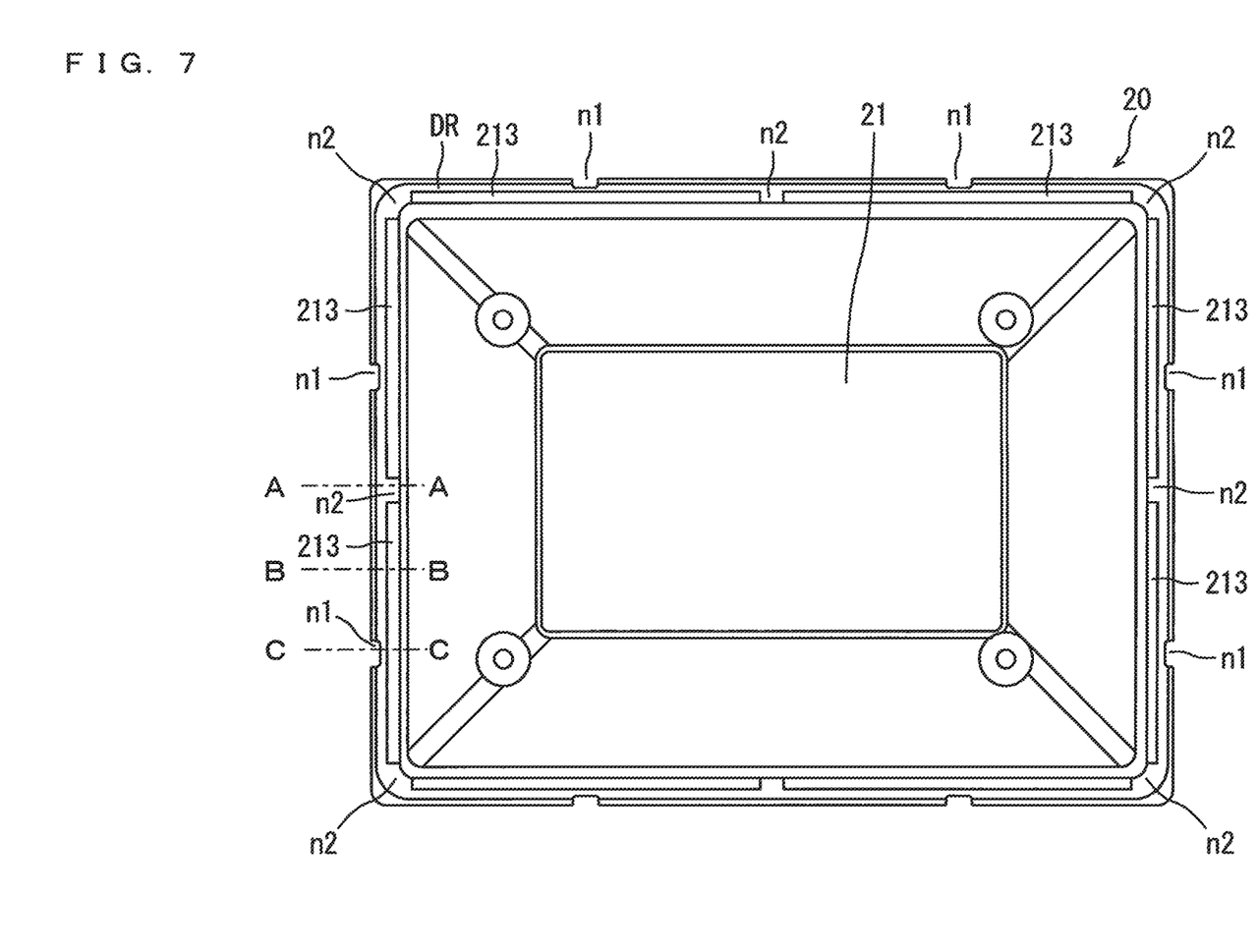
FIG. 7 is a plan view of a lid.
Figure 8:
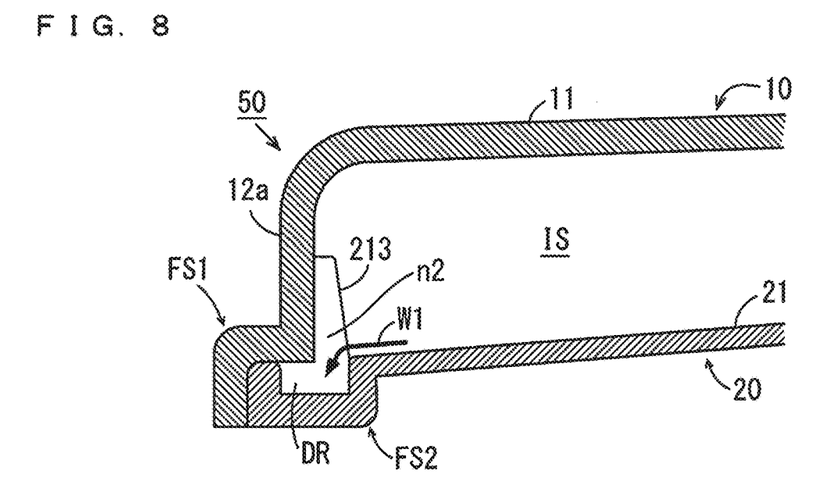
FIG. 8 is a cross-sectional view taken along the line A-A of FIGS. 4 and 7.

FIG. 7 is a plan view of the lid 20. A groove is provided as a drainage path DR to extend along the outer peripheral edge of the upper surface of the lower plate 21 of the lid 20. FIG. 8 is a cross-sectional view taken along the line A-A of FIGS. 4 and 7, FIG. 9 is a cross-sectional view taken along the line B-B of FIGS. 4 and 7, and FIG. 10 is a cross-sectional view taken along the line C-C of FIGS. 4 and 7.

Figure 9:
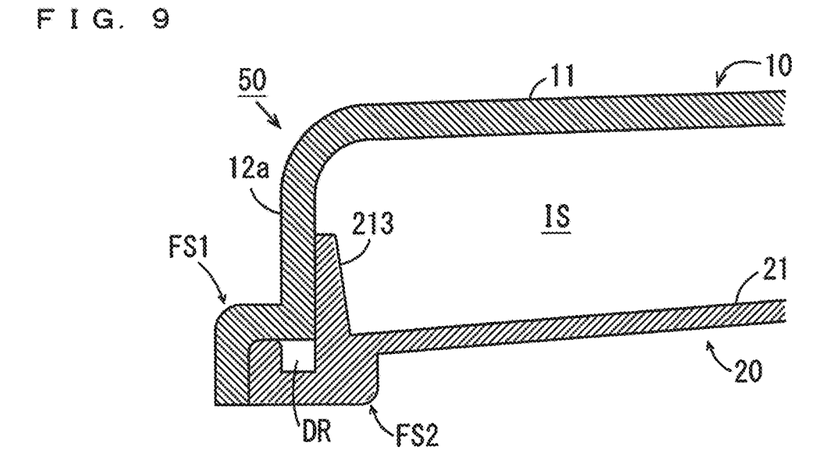
FIG. 9 is a cross-sectional view taken along the line B-B of FIGS. 4 and 7.
Figure 10:
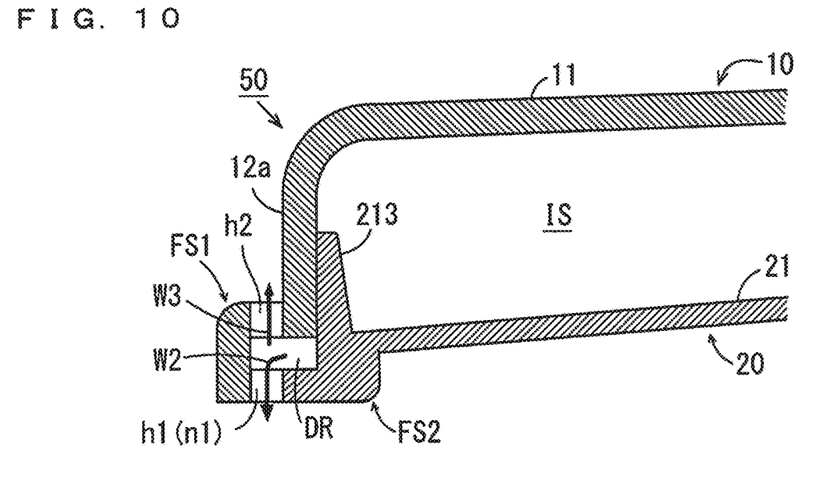
FIG. 10 is a cross-sectional view taken along the line C-C of FIGS. 4 and 7.

As shown in FIGS. 8 to 10, the lower end of the outer wall 12a is bent horizontally and outwardly and then further bent downwardly. The structure of the lower ends of the outer walls 12b to 12d is similar to the lower end of the outer wall 12a. Thus, a first bending structure FS1 is provided in the lower edges of the outer walls 12a to 12d.

The outer periphery of the lid 20 is bent downwardly, bent horizontally and outwardly, and further bent upwardly. Thus, a second bending structure FS2 is provided in the outer edge of the lid 20. In this case, the lower edges of the outer walls 12a to 12d are fitted to the outer edge of the lid 20, and a labyrinth structure is defined by the first bending structure FS1 of the casing 10 and the second bending structure FS2 of the lid 20. As a result, water intrusion into the inner space IS of the housing 50 is reduced even with the casing 10 and the lid 20 not having a completely sealed structure.

Further, the drainage path DR is defined by the second bending structure FS2. The drainage path DR is provided in the outer edge at the lower end of the housing 50. As shown in FIG. 8, the drainage path DR communicates with the inner space IS of the housing 50 through the cutout n2 of the lid 20. Thus, the water that has intruded into the inner space IS is guided to the drainage path DR as indicated by the arrow W1. As shown in FIG. 9, as for the portions except for the cutouts n1, n2, the upper portion of the drainage path DR is closed by the outer wall 12a (and the outer walls 12b to 12d). As shown in FIG. 10, a drainage hole h1 that communicates with the space below is defined by the cutout n1 of the lid 20 and the outer wall 12a (and the outer walls 12b to 12d) of the casing 10. The water that has been guided to the drainage path DR is drained downwardly through the drainage hole h1 as indicated by the arrow W2. A drainage hole h2 that communicates with the outer space above is provided in the outer wall 12a (and the outer walls 12b to 12d). In this example, each drainage hole h2 is located above the drainage hole h1. The drainage hole h1 is an example of a first hole, and the drainage hole h2 is an example of a second hole.

In this case, water that has been guided from the inner space IS of the housing 50 to the drainage path DR drains downwardly from the housing 50 through the drainage hole h1. Meanwhile, water that has splashed and entered into the drainage path DR from below the housing 50 through the drainage hole h1 is directly drained through the upper drainage hole h2 as indicated by the arrow W3. Thus, water is unlikely to intrude into the inner space IS of the housing 50 through the drainage path DR.

(2) Vehicle Including Communication Unit 1

Figure 11:
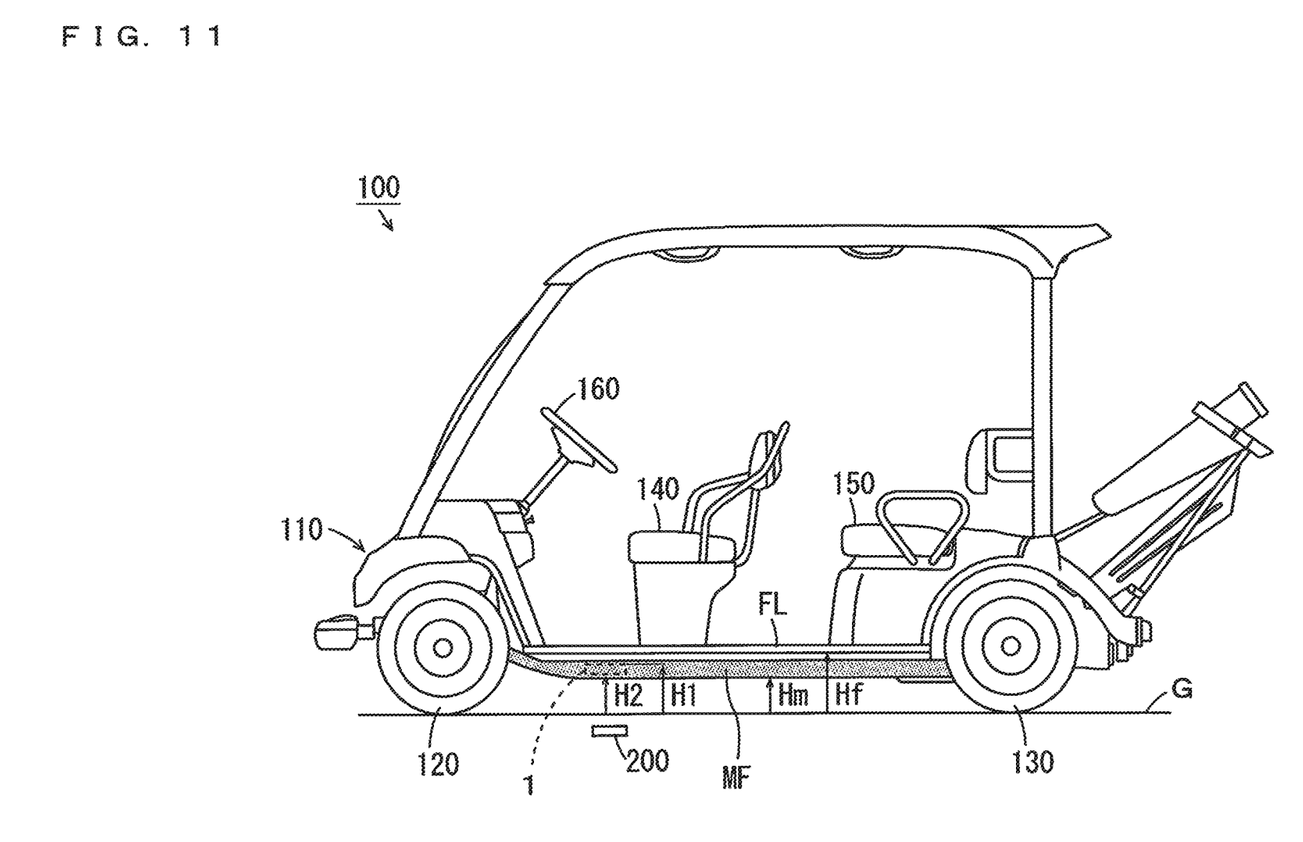
FIG. 11 is an external side view of a golf cart including the communication unit of FIG. 1.
Figure 12:
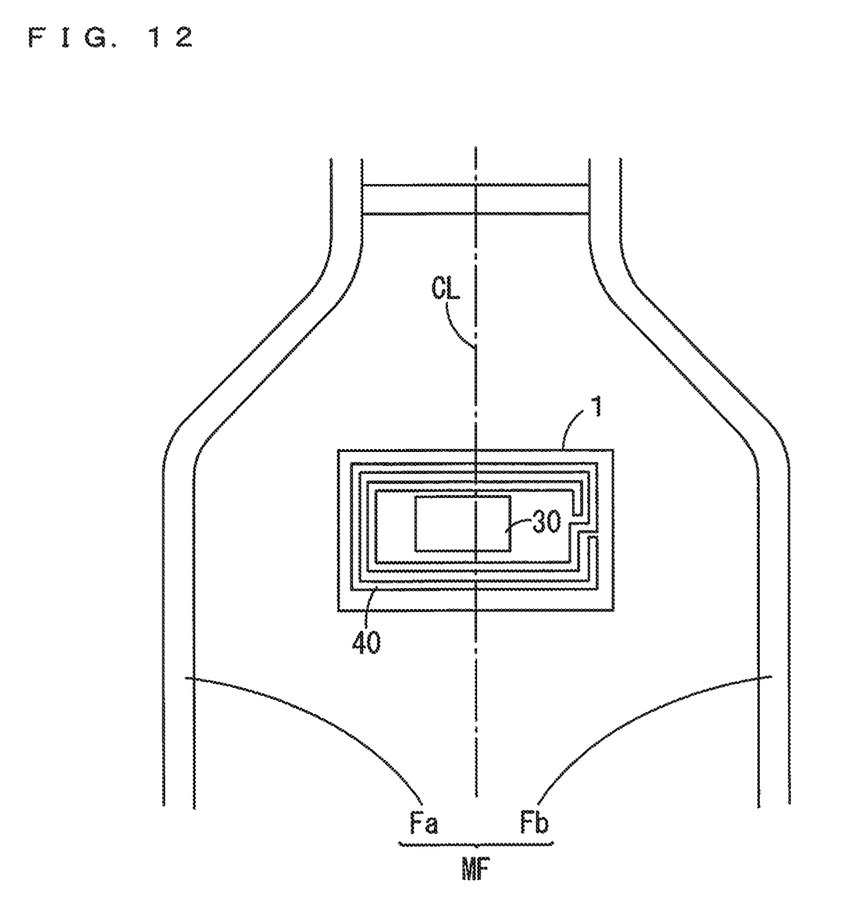
FIG. 12 is a plan view showing the position of the communication unit in the golf cart.

Next, a golf cart will be described as an example of the vehicle including the communication unit 1. FIG. 11 is an external side view of the golf cart including the communication unit 1 of FIG. 1. FIG. 12 is a plan view showing the position of the communication unit in the golf cart. As shown in FIG. 11, the golf cart 100 includes a vehicle body 110, a pair of steering wheels 120, which are front wheels, and a pair of rear wheels 130. The vehicle body 110 includes a main frame MF. A floor member FL is provided above the main frame MF.

A front seat 140 is provided substantially in the center portion on the floor member FL, and a rear seat 150 is provided in a rear portion on the floor member FL. A handle 160 is provided forwardly of the front seat 140. A passenger who is seated on the front seat 140 operates the handle 160, such that the direction of the steering wheels 120 is adjusted, and the golf cart 100 is steered. An RFID tag 200 is buried in the ground G.

The uppermost portion of the communication unit 1 is located at a position farther downward than the lower surface of the floor member FL, and the lowermost portion of the communication unit 1 is located at a position farther upward than the lower end of the main frame MF. That is, the height H1 from the ground G to the uppermost portion of the communication unit 1 is smaller than the height Hf from the ground G to the floor member FL. Further, the height H2 from the ground G to the lowermost portion of the communication unit 1 is larger than the height Hm from the ground G to the lower end of the main frame MF.

As shown in FIG. 12, the main frame MF includes the left and right frame members Fa, Fb. The communication unit 1 is located between the left and right frame members Fa, Fb. In the present example, the communication unit 1 is located on the center axis CL between the left and right frame members Fa, Fb.

With such an arrangement, the distance between the antenna 40 and the RFID tag 200 in the ground G is reduced. Thus, a good communication state between the communication unit 1 and the RFID tag 200 is maintained. Further, because the communication unit 1 is located at a position farther upward than the lowermost end of the main frame MF, contact of the communication unit 1 with the ground G during traveling of the golf cart 100 is avoided. Further, when the golf cart 100 is transported by a forklift, forks do not come into contact with the communication unit 1. Thus, damage to the communication unit 1 is significantly reduced or prevented.

Further, the antenna 40 of the communication unit 1 is located at a position closer to the steering wheels 120 than to the rear wheels 130. Thus, a change in distance between the antenna 40 and the RFID tag 200 caused by a turning radius difference between inner wheels and a turning radius difference between outer wheels depending on a steering angle of the steering wheels 120 is significantly reduced or prevented. As a result, stable communication between the communication unit 1 and the RFID tag 200 is maintained.

(3) Effects of the Preferred Embodiments

Figure 13:
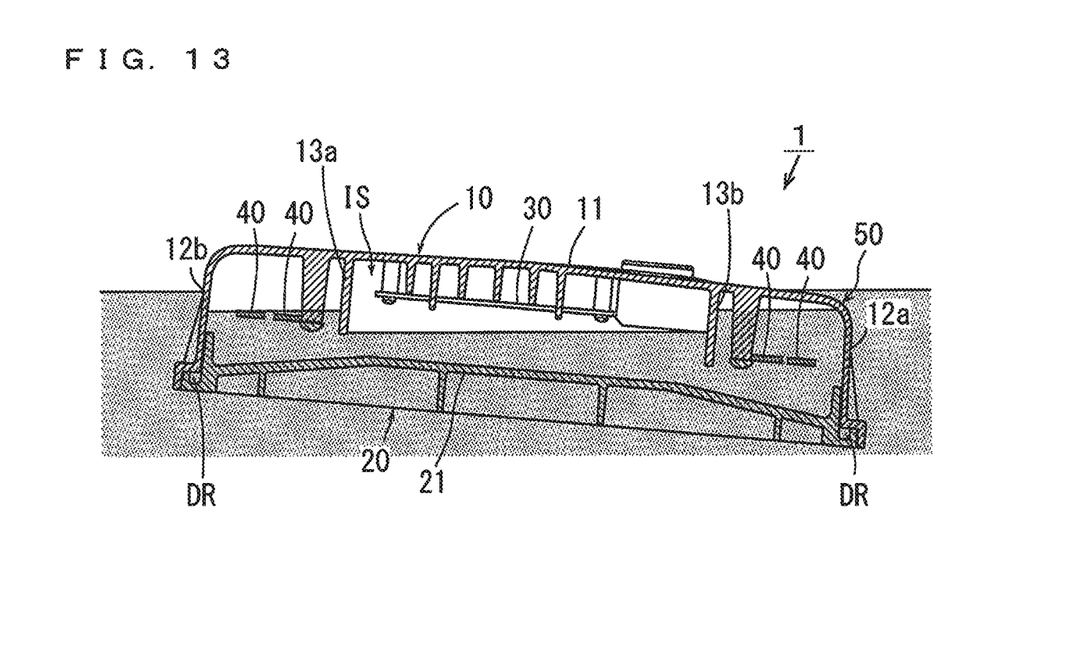
FIG. 13 is a schematic diagram showing the communication unit when water has intruded into the communication unit.

FIG. 13 is a schematic diagram showing the communication unit 1 when water has intruded into the communication unit 1. In a case where the golf cart 100 travels through a puddle, for example, the communication unit 1 may tilt, and water may temporarily intrude into the inner space IS of the housing 50. Even in such a case, because the circuit board 30 is surrounded by the upper plate 11 and the inner walls 13a to 13d in the communication unit 1 according to the present preferred embodiment, the intruding water is unlikely to reach the circuit board 30. In the example of FIG. 13, the water level in the inner space IS of the housing 50 is lower than the water level outside of the housing 50, and the water level in the space surrounded by the upper plate 11 and the inner walls 13a to 13d is lower than the water level outside of the inner walls 13a to 13d. Thus, adhesion of water to the circuit board 30 is significantly reduced or prevented.

Further, in the communication unit 1 according to the present preferred embodiment, the circuit board 30 is not sealed with resin, and the housing 50 does not require a completely sealed structure. Thus, the manufacturing cost is reduced, and the manufacturing process is not complicated. Therefore, even in a case where the communication unit 1 is located at a position close to the ground G, the influence of water is reduced without the requirement of a completely sealed structure. Further, the communication unit 1 is manufactured easily at low cost. Further, the electronic components 31 on the circuit board 30 are easily adjusted after the communication unit 1 is manufactured.

In the present preferred embodiment, because the labyrinth structure is provided by the first bending structure FS1 of the casing 10 and the second bending structure FS2 of the lid 20, water intrusion into the inner space IS of the housing 50 is reduced even with the casing 10 and the lid 20 not having a completely sealed structure.

Further, because the drainage path DR is provided in the outer edge at the lower end of the housing 50, even in a case where water intrudes into the inner space IS of the housing 50, the water is moved to the lower portion of the inner space IS by gravity and drained through the drainage path DR of the housing 50. Thus, water staying in the inner space IS of the housing 50 is significantly reduced or prevented.

Further, since the upper surface of the lower plate 21 of the lid 20 is inclined outwardly and downwardly, in a case where water intrudes into the inner space IS of the housing 50, the water adhering to the upper surface of the lower plate 21 of the housing 50 is likely to flow downwardly to the drainage path DR outside. Thus, water staying in the inner space IS of the housing 50 is significantly reduced or prevented.

The degradation of performance due to temporary adhesion of water to the antenna 40 is small as compared to adhesion of water to the circuit board 30. In the present preferred embodiment, because the circuit board 30 is located in the space inside of the inner walls 13a to 13d, and the antenna 40 is located in the space between the inner walls 13a to 13d and the outer walls 12a to 12d, the space inside of the inner walls 13a to 13d surrounding the circuit board 30 is reduced. Thus, the distance between the inner walls 13a to 13d and the outer walls 12a to 12d is increased. As a result, the circuit board 30 is protected from the water that has intruded into the inner space IS of the housing 50.

Further, because the antenna 40 is suspended from the upper plate 11 of the housing 50 in the inner space IS, the water adhering to the antenna 40 is likely to drop, and water staying on the surface of the antenna 40 is significantly reduced or prevented. As a result, significant degradation of performance of the antenna 40 is significantly reduced or prevented.

In the present preferred embodiment, the circuit board 30 is located at a position higher than the antenna 40. In this case, the likelihood of the circuit board 30 coming into contact with water is reduced while the distance between the antenna 40 and the ground G is reduced.

(4) Other Preferred Embodiments

Figure 14:
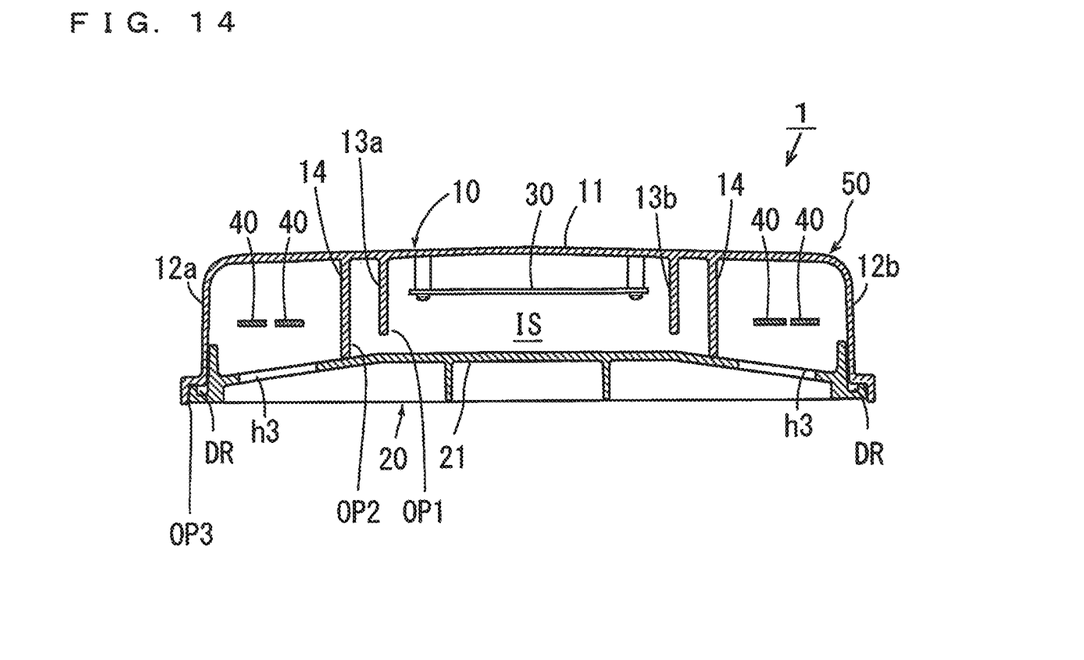
FIG. 14 is a cross-sectional view of a communication unit according to another preferred embodiment of the present invention.

FIG. 14 is a cross-sectional view of a communication unit 1 according to another preferred embodiment of the present invention. The communication unit 1 of FIG. 14 differs from the communication unit 1 of FIG. 1 in that an intermediate wall 14 is provided between the outer walls 12a to 12d and the inner walls 13a to 13d of the casing 10. The intermediate wall 14 surrounds the entire periphery of the inner walls 13a to 13d in a plan view and projects from the lower surface of the upper plate 11 to a position farther downward than the lower ends of the inner walls 13a to 13d in a side view. The casing 10 includes a lower opening (hereinafter referred to as an inner opening OP1) surrounded by the lower ends of the inner walls 13a to 13d, a lower opening (hereinafter referred to as an intermediate opening OP2) surrounded by the lower end of the intermediate wall 14, and a lower opening (hereinafter referred to as an outer opening OP3) surrounded by the lower ends of the outer walls 12a to 12d.

The outer edge of the intermediate opening OP2 is located at the lower end of the intermediate wall 14. The outer edge of the outer opening OP3 is located at the lower ends of the outer walls 12a to 12d. In the communication unit 1 of FIG. 1, the outer opening OP3 is closed by the lower plate 21 of the lid 20. In contrast, in the communication unit 1 of FIG. 14, the intermediate opening OP2 is closed by the lower plate 21 of the lid 20. In the region outside of the intermediate wall 14, holes h3 may be provided in the lower plate 21. Because the circuit board 30 is also surrounded by the upper plate 11 and the inner walls 13a to 13d in the configuration of FIG. 14, the water that has intruded into the inner space IS of the housing 50 is unlikely to reach the circuit board 30. The antenna 40 may be located in the space between the intermediate wall 14 and the inner walls 13a to 13d.

While the antenna 40 is located in the space between the outer walls 12a to 12d and the inner walls 13a to 13d in the above-described preferred embodiments, the present invention is not limited to this. The antenna 40 may be located in the space surrounded by the inner walls 13a to 13d. While the antenna 40 surrounds the inner walls 13a to 13d in the above-described preferred embodiments, the present invention is not limited to this. The antenna 40 may be located in a portion of the region between the outer walls 12a to 12d and the inner walls 13a to 13d.

While the circuit board 30 is located at a position higher than the antenna 40 in the inner space IS of the housing 50 in the above-described preferred embodiments, the present invention is not limited to this. The antenna 40 may be located at a position as high as the circuit board 30 or at a position higher than the circuit board 30.

While the casing 10 includes the upper plate 11 and the outer walls 12a to 12d, and the lid 20 includes the lower plate 21 in the above-described preferred embodiments, the present invention is not limited to this. A lid may include the upper plate 11, and a casing may include the lower plate 21 and the outer walls 12a to 12d.

While the drainage path DR is provided in an edge at the lower end of the housing 50 in the above-described preferred embodiments, the present invention is not limited to this. For example, the drainage path DR may be provided in a center portion of the lower plate 21 of the housing 50. Alternatively, the drainage path DR does not have to be provided.

While the labyrinth structure is defined by the first bending structure FS1 of the casing 10 and the second bending structure FS2 of the lid 20 in the above-described preferred embodiments, the present invention is not limited to this. In a case where an amount of water that intrudes from the connection between the casing 10 and the lid 20 is small, the labyrinth structure does not have to be provided.

While the upper surface of the lower plate 21 of the lid 20 is inclined outwardly and downwardly in the above-described preferred embodiments, the present invention is not limited to this. The upper surface of the lower plate 21 of the lid 20 may be a horizontal plane. Alternatively, the upper surface of the lower plate 21 of the lid 20 may be inclined inwardly and downwardly. In that case, a drainage path or a drainage hole may be provided in the center portion of the lower plate.

While the steering wheels 120 of the golf cart 100 are the front wheels in the above-described preferred embodiments, the present invention is not limited to this. The rear wheels may be steering wheels. In that case, the antenna 40 of the communication unit 1 is preferably located at a position closer to the steering wheels than to the front wheels. Further, the above-described arrangements of the communication unit 1 in the golf cart 100 is one example, and the communication unit 1 may be located in another portion of the golf cart 100. Further, the communication unit 1 is not limited to the golf cart 100 but may be provided in another vehicle such as a four-wheeled vehicle or an automobile.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A communication unit comprising:
a circuit board on which a communication circuit is provided;
an antenna connected to the communication circuit; and
a housing that stores the circuit board and the antenna; wherein
the housing includes an upper plate, a lower plate, and an outer wall, the upper plate is located above the lower plate, and an inner space is defined by the upper plate, the lower plate, and the outer wall; and
an inner wall is provided in the inner space and surrounds an entire periphery of the circuit board in a plan view and projects from a lower surface of the upper plate to a position farther downward than the circuit board in a side view.

2. The communication unit according to claim 1, wherein
the housing further includes a supporter that supports the antenna in the inner space such that a first space is provided between the antenna and the lower surface of the upper plate and a second space is provided between the antenna and an upper surface of the lower plate;
the supporter includes a plurality of projections that project downwardly from the lower surface of the upper plate; and
the antenna is supported by the plurality of projections in the inner space.

3. The communication unit according to claim 2, wherein
the antenna includes a first antenna portion and a second antenna portion that are adjacent but spaced apart from each other;
the plurality of projections include a first projection that supports the first antenna portion and a second projection that supports the second antenna portion; and
the plurality of projections are located such that a supporting portion of the first projection with respect to the first antenna portion and a supporting portion of the second projection with respect to the second antenna portion are discontinuous.

4. The communication unit according to claim 1, wherein
the housing includes a casing including the upper plate and the outer wall and includes a lower opening; and
a lid including the lower plate and that closes the lower opening of the casing;
an outer edge of the lower opening is located outside of a region surrounded by a lower end of the inner wall in the plan view; and
the inner space is defined by the outer wall of the casing and the lid being connected to each other.

5. The communication unit according to claim 4, wherein the outer edge of the lower opening is located at a lower end of the outer wall.

6. The communication unit according to claim 4, wherein
a lower edge of the outer wall of the casing includes a first bending structure;
an outer edge of the lid includes a second bending structure; and
the lower edge of the outer wall and the outer edge of the lid are connected to each other, and a labyrinth structure is defined by the first bending structure and the second bending structure.

7. The communication unit according to claim 1, wherein a drainage path is provided in an edge at a lower end of the housing.

8. The communication unit according to claim 7, wherein a first hole is provided in the housing and communicates the drainage path with a space below the housing; and a second hole is provided in the housing and communicates the drainage path with a space outside of the housing above the first hole.

9. The communication unit according to claim 1, wherein an upper surface of the lower plate of the housing is inclined outwardly and downwardly.

10. The communication unit according to claim 1, wherein the antenna is located between the outer wall and the inner wall.

11. The communication unit according to claim 1, wherein the circuit board is located at a position higher than the antenna.

12. A vehicle comprising:

a main frame including a pair of left and right frame portions;

a floor located at a position farther upward than the main frame;

a steering wheel to support the main frame on the ground in a vehicle front-and-rear direction; and the communication unit according to claim 1; wherein the communication unit is located between the pair of left and right frame portions in a plan view of the vehicle; and an uppermost portion of the communication unit is located at a position farther downward than a lower surface of the floor, and a lowermost portion of the communication unit is located at a position farther upward than a lower end of the main frame.

13. The vehicle according to claim 12, further comprising:

a wheel provided at a position farther forward or rearward than the steering wheel in a side view of the vehicle; wherein the antenna of the communication unit is located at a position closer to the steering wheel than to the wheel in the side view of the vehicle.

* * * * *